United States Patent
Lee et al.

(10) Patent No.: US 10,530,249 B1
(45) Date of Patent: Jan. 7, 2020

(54) CHARGE PUMP WITH SWITCHING LDO FUNCTION FOR OUTPUT VOLTAGE REGULATION

(71) Applicant: Dialog Semiconductor (UK) Limited, London (GB)

(72) Inventors: Jong Lee, Pleasanton, CA (US); Sabin Eftimie, San Jose, CA (US)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 16/237,185

(22) Filed: Dec. 31, 2018

(51) Int. Cl.
*H02M 3/07* (2006.01)
*G05F 1/575* (2006.01)
*G05F 3/26* (2006.01)
*G01R 19/165* (2006.01)
*H03K 5/24* (2006.01)
*H02M 1/00* (2006.01)

(52) U.S. Cl.
CPC ........ *H02M 3/07* (2013.01); *G01R 19/16528* (2013.01); *G05F 1/575* (2013.01); *G05F 3/262* (2013.01); *H03K 5/24* (2013.01); *H02M 2001/0009* (2013.01)

(58) Field of Classification Search
CPC .......... H02M 3/07; H02M 3/073; H02M 7/10; H02M 2003/077; H02M 2003/076
USPC ................. 363/59–60; 327/535–541
See application file for complete search history.

(56) References Cited

U.S. PATENT DOCUMENTS

| | | |
|---|---|---|
| 5,180,964 A | 1/1993 | Ewing |
| RE37,609 E | 3/2002 | Bittner |
| 6,452,816 B2 | 9/2002 | Kuranuki et al. |
| 6,545,882 B2 | 4/2003 | Yang |
| 6,885,176 B2 | 4/2005 | Librizzi |
| 7,098,641 B2 | 8/2006 | King |

(Continued)

FOREIGN PATENT DOCUMENTS

| | | |
|---|---|---|
| CN | 106130344 | 11/2016 |
| DE | 2 323 482 | 11/1974 |

OTHER PUBLICATIONS

PCT International Search Report and Written Opinion, PCT Application No. PCT/US2009/064618, dated Jan. 13, 2010, 10 pages.

(Continued)

*Primary Examiner* — Nguyen Tran
(74) *Attorney, Agent, or Firm* — Saile Ackerman LLC; Stephen B. Ackerman

(57) ABSTRACT

Power converters, charge pumps and methods which are capable of regulating output voltage are presented. A power converter has a capacitive element, a first transistor, a second transistor, a third transistor, and a fourth transistor. The first transistor is coupled between an input terminal and a first terminal of the capacitve element. The second transistor is coupled between the first terminal of the capacitve element and an output terminal. The third transistor is coupled between the output terminal and a second terminal of the capacitive element. The fourth transistor is coupled between the second terminal of the capacitive element and a reference potential. The power converter has a control circuit to control, during a first time interval of a voltage regulation mode, one of the four transistors such that the one of the four transistors is operated as a controllable power source for regulating an output voltage.

18 Claims, 16 Drawing Sheets

(56) References Cited

U.S. PATENT DOCUMENTS

| | | | |
|---|---|---|---|
| 7,368,897 | B2 | 5/2008 | Qahouq et al. |
| 7,403,400 | B2 | 7/2008 | Stanley |
| 7,804,282 | B2 | 9/2010 | Bertele |
| 8,018,212 | B1 | 9/2011 | Petricek |
| 8,018,743 | B2 | 9/2011 | Wang et al. |
| 8,049,481 | B2 | 11/2011 | Li et al. |
| 9,929,653 | B1 | 3/2018 | Mercer et al. |
| 9,997,946 | B2 | 6/2018 | Kogler et al. |
| 2004/0136213 | A1* | 7/2004 | Fujise .............. H02M 3/07 363/62 |
| 2006/0273772 | A1 | 12/2006 | Groom |
| 2011/0267018 | A1 | 11/2011 | Tao |
| 2014/0009220 | A1* | 1/2014 | Jiang .............. H02M 3/07 327/536 |
| 2015/0002116 | A1 | 1/2015 | Bemon-Enjalbert et al. |
| 2016/0105110 | A1 | 4/2016 | Houston et al. |
| 2016/0294277 | A1 | 10/2016 | Romeo |
| 2018/0287489 | A1 | 10/2018 | Ozanoglu et al. |

OTHER PUBLICATIONS

PCT International Search Report and Written Opinion, PCT Application No. PCT/US2010/023219, dated Apr. 12, 2010, 7 pages.

"Buck-Boost Converter Controlled by Hysteretic PWM Method with Input Voltage Feedforward," by Tomonori Watanabe et al., 2011 IEEE 33rd International Telecommunications Energy Conference (INTELEC), Oct. 9-13, 2011, 6 pages.

German Office Action, File No. 10 2017 212 349.4, Applicant: Dialog Semiconductor (UK) Limited, dated Mar. 13, 2018, 9 pages and English language translation, 7 pages.

Co-pending U.S. Appl. No. 16/050,746, filed Jul. 31, 2018, "Multi-level Power Converter with Light Load Flying Capacitor Voltage Regulation", by Aravind Mangudi et al., 35 pages.

"The forgotten converter," by Greg Lubarsky, Texas Instruments, Jul. 8, 2015, 10 pages, www.ti.com/lit/wp/slpy.005/slpy005.pdf.

DA9318 High-Efficiency, 10 A, High-Voltage Direct Charger, 4 pages, Copyright Dialog Semiconductor 2017, www.dialog-semiconductor.com.

* cited by examiner

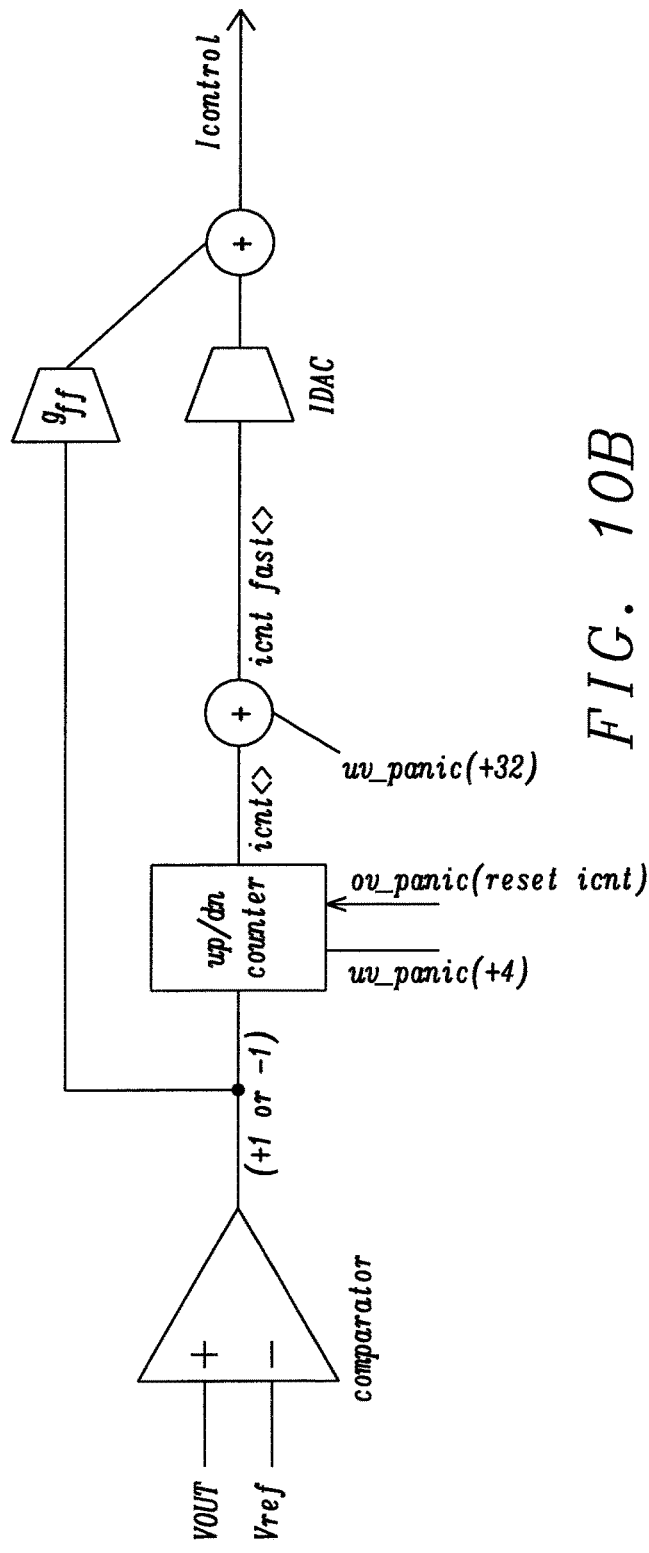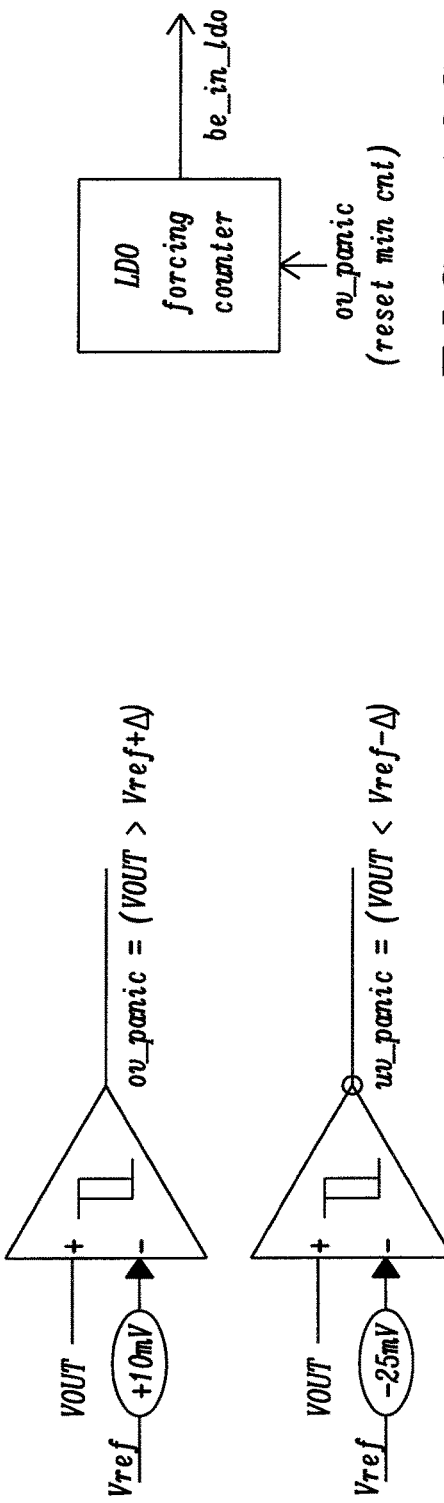
FIG. 10B
FIG. 10C
FIG. 10A

US 10,530,249 B1

CHARGE PUMP WITH SWITCHING LDO FUNCTION FOR OUTPUT VOLTAGE REGULATION

TECHNICAL FIELD

The present document relates to charge pump circuits. In particular, the present document relates to the design of charge pump circuits which are capable of regulating an output voltage e.g. for protecting a battery coupled to an output of a charge pump circuit.

BACKGROUND

Several ideas of regulating an output voltage of a charge pump have been presented in the literature. For example, methods of linear voltage regulation have been suggested either at the input or at the output of a charge pump. By adding a linear regulator (such as e.g. a low-dropout LDO regulator) at the input of a charge pump, the input voltage is dropped (or regulated) before a charge pump divides the dropped voltage to one half for output. If a linear regulator is added at the output of a charge pump, the linear regulator simply regulates the output voltage of a charge pump. For these implementations, a power device for the linear regulation must be added in series on the current path of a charge pump. And that additional power device may take significant die area and burn extra power even in the case that the charge pump is switching for voltage division without using the regulation function implemented by the additional linear regulator.

SUMMARY

The present document addresses the above mentioned technical problems. In particular, the present document addresses the technical problem of providing an improved charge pump capable of regulating its output voltage with improved efficiency and with a reduced number of additional circuit elements.

According to an aspect, a power converter comprises a capacitive element, a first transistor, a second transistor, a third transistor, and a fourth transistor. The first transistor is coupled between an input terminal of the power converter and a first terminal of the capacitve element. The second transistor is coupled between the first terminal of the capacitve element and an output terminal of the power converter. The third transistor is coupled between the output terminal of the power converter and a second terminal of the capacitive element. The fourth transistor is coupled between the second terminal of the capacitive element and a reference potential. The power converter further comprises a control circuit configured to enter a voltage regulation mode, and to control, during a first time interval of said voltage regulation mode, one of the four transistors such that the one of the four transistors is operated as a controllable power source for regulating an output voltage or an output current at the output terminal or an input voltage or an input current at the input terminal of the power converter or a temperature of a component associated to the power converter. For simplicity, we will continue to refer in the description to a voltage regulation mode which is regulating the output voltage of the converter. Also, the term "power source" is used here to describe for example a transistor capable to control (limit) the current flowing through it or the voltage at one of its terminals based on a controlling signal.

The four transistors may be of the same type or may be of different types. Each transistor may be implemented with any suitable device, such as, for example, an n-channel or p-channel metal-oxide-semiconductor field effect transistor MOSFET, an insulated-gate bipolar transistor IGBT, a MOS-gated thyristor, or other suitable power device. Each transistor has a gate to which a respective driving voltage or control signal may be applied to control the current flowing through said transistor.

Throughout this document, the term "reference potential" is meant in its broadest possible sense. In particular, the reference potential is not limited to ground i.e. a reference potential with a direct physical connection to earth. Rather, the term "reference potential" may refer to any reference point to which and from which electrical currents may flow or from which voltages may be measured. The capacitive element may be e.g. a capacitor.

Due to the arrangement of transistors relative to the capacitive element, the described power converter may also be denoted as a charge pump. In conventional charge pumps, all transistors are operated as switches which are either open or closed, i.e. completely turned off or completely turn on. For example, in conventional charge pumps, all involved transistors may be MOSFETs operated in saturation. In other words, all involved transistors may be MOSFETs operated by alternating them between fully on and fully off mode. In the described power converter, however, one of the four transistors is selected to be operated as a controllable power source i.e. to be operated as a controlled current source or as a controlled voltage source. In other words, the selected transistor is operated as a variable resistive element, i.e. as a resistive element whose resistance value is continuously adaptable. As a result, the current through the selected transistor may be continuously adapted or the voltage drop across the selected transistor may be continuously adapted. For example, the selected transistor may be a MOSFET operated in the linear region. In yet other words, the selected transistor may be controlled by the control circuit to limit the current through the selected transistor and, thus, to limit the current which is charging the capacitive element during the first time interval of said voltage regulation mode. Since the output voltage at the output terminal of the power converter is regulated by operating the selected transistor as a controllable power source, the power converter is enabled to not only divide the input voltage of into half, but to truly regulate the output voltage just as an LDO regulator.

One advantage of the described power converter is that one of the transistors of the power converter is used (a) as a controllable power source for regulation the output voltage of the power converter and (b) as a switching element when the power converter is used as a regular charge pump for dividing the input voltage into half and for doubling the output current compared to the input current. Therefore, the described implementation does not require any additional power devices and does not have additional power losses when the power converter is operated as charge pump in a pure switching mode.

The output voltage of the power converter is typically used to supply driver circuits for driving the third and the fourth transistor with power. Therefore, another major advantage of the switching LDO regulation feature is the protection of said driver circuits (and the third and fourth transistors themselves) in case of an overvoltage at the input terminal which may lead to an overvoltage at the output terminal.

The power converter may comprise a first current mirror configured to control a current through the one of the four transistors for regulating the output voltage at the output terminal of the power converter. Said first current mirror may comprise e.g. the selected one of the four transistors and a complementary mirror transistor. In particular, the first current mirror may be configured to copy a potentially scaled version of a reference current flowing through said complementary mirror transistor to the selected one of the four transistors during said first time interval of the voltage regulation phase. In addition, the control circuit may comprise a second current mirror for providing said reference current to said first current mirror.

The control circuit may be configured to enter the voltage regulation mode if an overvoltage is detected at the input terminal of the power converter. Alternatively, the overvoltage for triggering the mode change may be detected at the output terminal of the power converter. Other possible implementations are detecting overcurrent at the output terminal, input terminal or into a battery, or detecting an overvoltage at the battery. For example, the overvoltage at the input terminal of the power converter may be detected with the help of a comparator circuit. As already mentioned, control circuit may be configured to, during the first time interval of the voltage regulation mode, control the three remaining transistors such that the three remaining transistors are operated as switches which are either (completely) open or (completely) closed.

Depending on which transistor is selected to be operated as controllable power source, the three remaining transistors may be either open or closed. If the first transistor is chosen as the one of the four transistors which is operated as a controllable power source during the first time interval, the control circuit is configured to generate, during the first time interval, control signals for operating the third transistor as a closed switch, and for operating the second and the fourth transistor as open switches. If the second transistor is chosen as the one of the four transistors which is operated as a controllable power source during the first time interval, the control circuit is configured to generate, during the first time interval, control signals for operating the fourth transistor as a closed switch, and for operating the first and the third transistor as open switches. If the third transistor is chosen as the one of the four transistors which is operated as a controllable power source during the first time interval, the control circuit is configured to generate, during the first time interval, control signals for operating the first transistor as a closed switch, and for operating the second and the fourth transistor as open switches. If the fourth transistor is chosen as the one of the four transistors which is operated as a controllable power source during the first time interval, the control circuit is configured to generate, during the first time interval, control signals for operating the second transistor as a closed switch, and for operating the first and the third transistor as open switches.

The control circuit may be configured to, during a second time interval of said voltage regulation mode, control the one of the four transistors such that the one of the four transistors is operated as an open switch. In particular, the control circuit may be configured to, during the second time interval of said voltage regulation mode, control also the three remaining transistors such that the three remaining transistors are operated as switches which are either open or closed.

If the first transistor is chosen as the one of the four transistors which is operated as a controllable power source during the first time interval, the control circuit is configured to generate, during the second time interval, control signals for operating the third transistor as an open switch, and for operating the second and the fourth transistor as closed switches. If the second transistor is chosen as the one of the four transistors which is operated as a controllable power source during the first time interval, the control circuit is configured to generate, during the second time interval, control signals for operating the fourth transistor as an open switch, and for operating the first and the third transistor as closed switches. If the third transistor is chosen as the one of the four transistors which is operated as a controllable power source during the first time interval, the control circuit is configured to generate, during the second time interval, control signals for operating the first transistor as an open switch, and for operating the second and the fourth transistor as closed switches. If the fourth transistor is chosen as the one of the four transistors which is operated as a controllable power source during the first time interval, the control circuit is configured to generate, during the second time interval, control signals for operating the second transistor as an open switch, and for operating the first and the third transistor as closed switches.

The control circuit may be configured to exit the voltage regulation mode and to enter a voltage division mode, and to control all four transistors such that all four transistors are operated as switches which are either open or closed. In particular, the control circuit may be configured to control the four transistors such that an output current at the output terminal is two times an input current at the input terminal, and such that an output voltage at the output terminal is half of an input voltage at the input terminal. Specifically, the control circuit may be configured to, during a first phase of the voltage division mode, to close the first transistor and the third transistor, and to open the second transistor and the fourth transistor for generating an electrical path from the input terminal via the capacitive element to the output terminal. The other way round, the control circuit may be configured to, during a second phase of the voltage division mode, to open the first transistor and the third transistor, and to close the second transistor and the fourth transistor for generating an electrical path from the reference potential via the capacitive element to the output terminal.

The control circuit may comprise a comparator configured to generate an error signal by comparing a reference signal with a feedback signal, an integrator or counter configured to generate a cumulated error signal based on the error signal, a controlled current source configured to generate a reference current based on the cumulated error signal, and a current mirror comprising the one of the four transistors and a mirror transistor, the current mirror configured to control a current through the one of the four transistors according to the reference current.

The feedback signal may be indicative of at least one of an input voltage at the input terminal of the power converter, an input current at the input terminal of the power converter, an output voltage at the output terminal of the power converter, an output current at the output terminal of the power converter, or a temperature associated with the power converter.

In other words, the control circuit may implement a feedback loop for regulating/limiting the output voltage at the output terminal of the power converter based on the feedback signal. It should be mentioned that this feedback loop simultaneously protects the circuit elements of the power converter—in particular the transistors—from being damaged by an overvoltage.

The components of this feedback loop may be either analog (such as e.g. the integrator) or digital (such as e.g. the counter). One advantage of using the integrator or counter is that the integrator or counter is capable of storing a state of the feedback loop, e.g. during the second time interval of the voltage regulation mode during which the selected one of the four transistors is operated as an open switch. Put in a different way, it may be said that integrator or counter remembers the state of the feedback loop during the second time interval of the voltage regulation mode during which the feedback loop is inactive. Therefore, the integrator or counter may be useful for storing a history indicative of previous error signals for increasing the stability and reliability of the feedback loop.

As already mentioned in the foregoing description, the power converter comprises at least one current mirror, and the control circuit may comprise e.g. two concatenated current mirrors. The comparator may e.g. generate a binary output signal indicating whether the feedback signal has a smaller or larger signal value than the reference signal. Alternatively or additionally, the comparator may include an error amplifier configured to generate and an analog output signal which is representative of an amplified difference between a signal value of the feedback signal and a signal value of the reference signal.

The control circuit may be configured to determine a time for exiting the voltage regulation mode and for entering a voltage division mode based on a state of said integrator or based on a state of said counter.

The control circuit may comprise a bypass switch for disabling the current mirror such that the one of the four transistors is operated as an open switch during the second time interval of said voltage regulation mode, or operated as a switch which is either open or closed when the control circuit has entered a voltage division mode. The bypass switch may be e.g. another transistor configured to short-circuit said current mirror. For this purpose, the bypass switch may be e.g. arranged in parallel to said current mirror.

The control circuit may be configured to, when entering the voltage regulation mode, control the one of the four transistors such that a current through this transistor is interrupted and then successively increased again. In case the control circuit includes an integrator, the current through this transistor may be increased continuously. Alternatively, in case the control circuit implements a digital feedback loop including a counter, the current through this transistor may be increased in discrete steps.

According to another aspect, a method for operating a power converter is described. The method may comprise steps which correspond to the features of the power converter described in the present document. Specifically, the method may be a method for operating a power converter comprising a capacitive element, a first transistor, a second transistor, a third transistor, and a fourth transistor. The method may comprise coupling the first transistor is between an input terminal of the power converter and a first terminal of the capacitve element, coupling the second transistor between the first terminal of the capacitve element and an output terminal of the power converter, coupling the third transistor between the output terminal of the power converter and a second terminal of the capacitive element, and coupling the fourth transistor between the second terminal of the capacitive element and a reference potential. In addition, the method may comprise entering a voltage regulation mode and controlling, during a first time interval of said voltage regulation mode, one of the four transistors such that the one of the four transistors is operated as a controllable power source for regulating an output voltage at the output terminal of the power converter. It should be mentioned that during the voltage regulation mode, also the output current, input current, input voltage or the temperature of the power converter or the temperature of a component associated with the power converter may be accordingly regulated.

The method may further comprise entering the voltage (or current or temperature) regulation mode if an overvoltage or overcurrent is detected at the input or output terminal of the power converter or if an overtemperature of a component associated with the power converter is detected. The method may comprise controlling, by a current mirror, a current through the one of the four transistors for regulating the output voltage at the output terminal of the power converter. The method may comprise controlling, during the first time interval of the voltage regulation mode, the three remaining transistors such that the three remaining transistors are operated as switches which are either open or closed. The method may comprise controlling, during a second time interval of said voltage regulation mode, the one of the four transistors such that the one of the four transistors is operated as an open switch. The method may comprise controlling, during the second time interval of said voltage regulation mode, the three remaining transistors such that the three remaining transistors are operated as switches which are either open or closed.

Further, the method may comprise generating an error signal by comparing a reference signal with a feedback signal, generating a cumulated error signal by integrating the error signal or by counting signal values of the error signal, providing a controlled current source for generating a reference current based on the cumulated error signal, and providing a current mirror comprising the one of the four transistors and a mirror transistor, for controlling a current through the one of the four transistors according to the reference current. At this, the feedback signal may be indicative of one of an input voltage at the input terminal of the power converter, an input current at the input terminal of the power converter, an output voltage at the output terminal of the power converter, an output current at the output terminal of the power converter, or a temperature associated with the power converter.

According to a further aspect, a software program is described. The software program may be adapted for execution on a processor and for performing the method steps outlined in the present document when carried out by the processor.

According to another aspect, a storage medium is described. The storage medium may comprise a software program adapted for execution on a processor and for performing the method steps outlined in the present document when carried out by the processor.

According to a further aspect, a computer program product is described. The computer program product may comprise instructions for performing the method steps outlined in the present document when carried out by the processor.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple", "connect", "coupled" or "connected" refers to elements being in electrical communication with each other, whether directly connected e.g., via wires, or in some other manner.

BRIEF DESCRIPTION OF THE DRAWINGS

The invention is explained below in an exemplary manner with reference to the accompanying drawings, wherein

FIGS. 10A, 10B and 10C show an improvement of the digital control loop for better transient response;

DESCRIPTION

Figure 1:
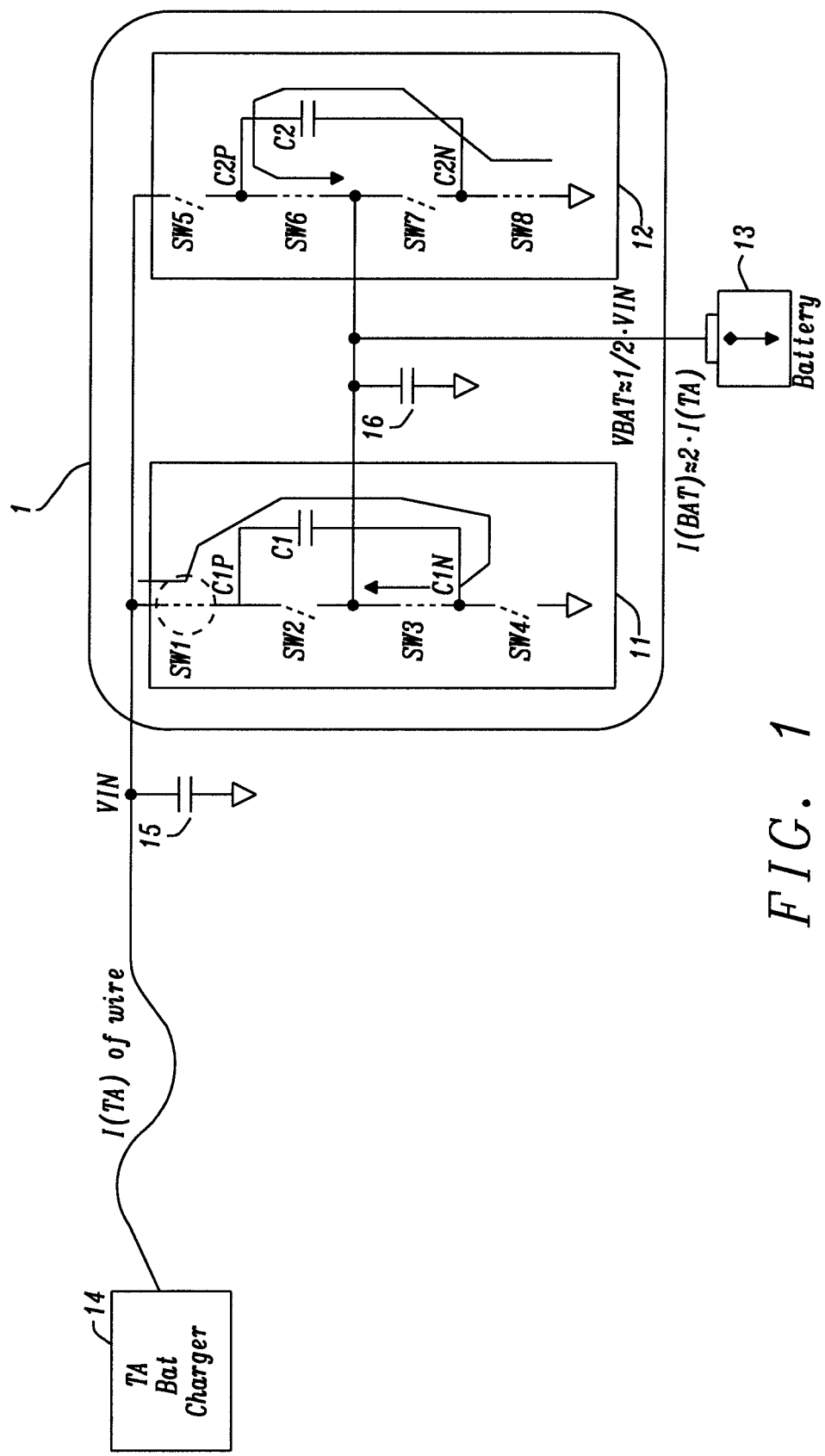
FIG. 1 illustrates an exemplary power converter connected between a travel adapter and a battery.

FIG. 1 illustrates an exemplary power converter 1 connected between a travel adapter 14 (also known as alternating current AC adapter, wall adapter, or domestic mains adapter) and a battery 13 for charging said battery 13. The power converter 1 comprises two identical charge pumps 11 and 12 with altogether eight power switches and two capacitors. Additionally, an input capacitor 15 is provided at the input terminal of the power converter 1 and an output capacitor 16 is provided at the output terminal of the power converter 1. The output voltage of power converter 1 is half of the input voltage of power converter 1. At the same time, the output current of power converter 1 is two times the input current of power converter 1.

Figure 2:
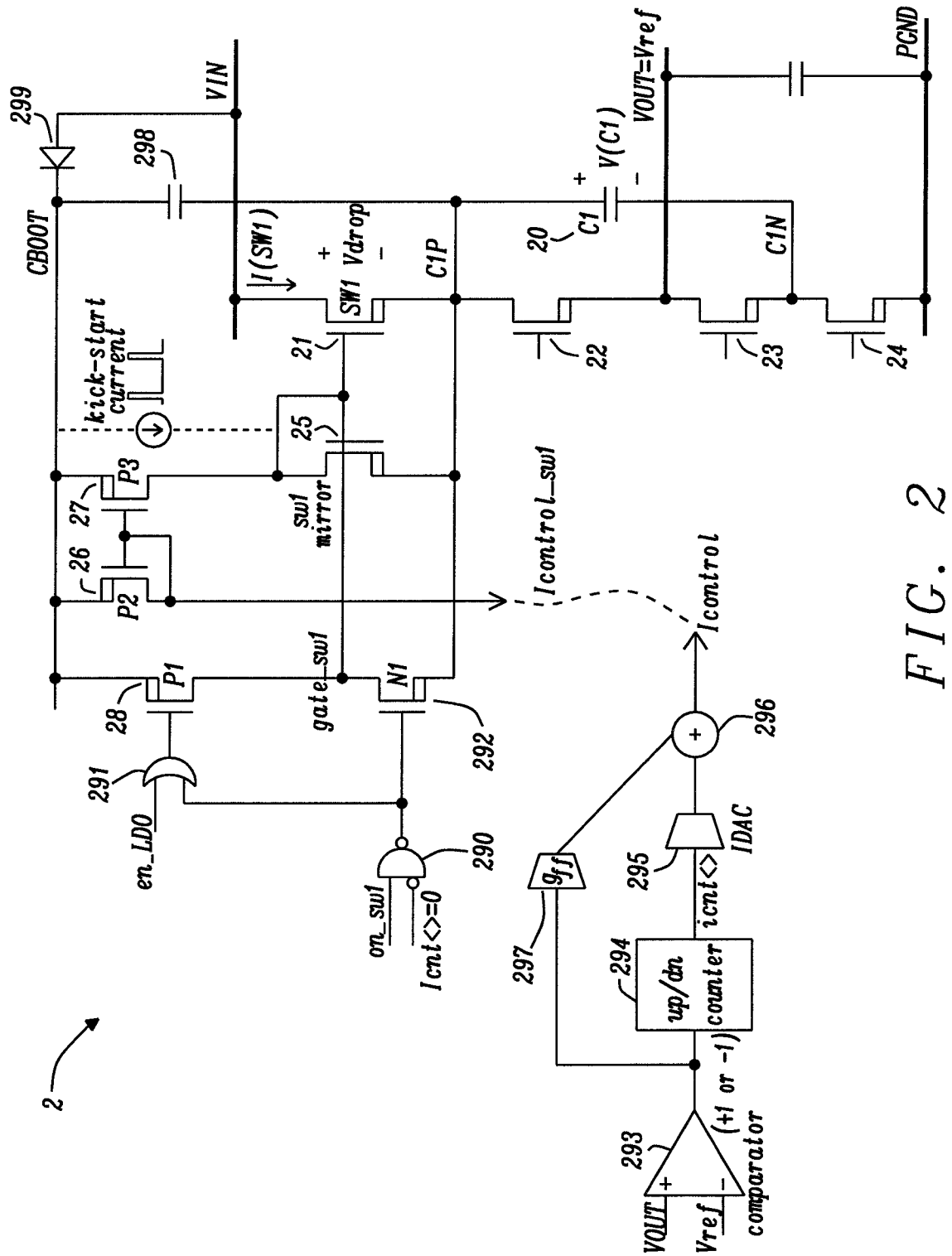
FIG. 2 shows an exemplary power converter with one transistor operated as a controllable power source.

FIG. 2 shows an exemplary power converter 2 with one transistor operated as a controllable power source. However, the circuit elements and control logic illustrated in FIG. 2 serve only as example useful for understanding the present invention, and the present invention is not limited to the specific embodiment shown in FIG. 2.

Particularly, the exemplary power converter 2 comprises a capacitive element 20, a first transistor 21, a second transistor 22, a third transistor 23, and a fourth transistor 24. The first transistor 21 is coupled between an input terminal of the power converter 2 and a first terminal C1P of the capacitve element 20. The second transistor 22 is coupled between the first terminal C1P of the capacitve element 20 and an output terminal of the power converter 2. The third transistor 23 is coupled between the output terminal of the power converter 2 and a second terminal C1N of the capacitive element 20. The fourth transistor 24 is coupled between the second terminal C1N of the capacitive element 20 and a reference potential. The power converter 2 further comprises a control circuit configured to enter a voltage regulation mode (also denoted as switching LDO mode in the following description) to control, during a first time interval of said voltage regulation mode, the first transistor 21 that the first transistor 21 is operated as a controllable power source for regulating an output voltage at the output terminal of the power converter 2.

The exemplary power converter 2 comprises a digital feedback loop with a comparator 293, a digital counter 294, a current digital analog converter IDAC 295, a gain factor 297, and an adder 296. The comparator 293 is configured to generate an error signal by comparing a reference voltage with the output voltage of the power converter 2. The digital counter 294 is configured to generate a cumulated error signal based on the error signal, and the IDAC 295 generates a reference current corresponding to the cumulated error signal. Gain factor 297 is then added for increasing the stability of the control loop. The current Icontrol generated at the output of adder 296 is used to control the current through the first transistor 21 via two current mirrors, wherein the first current mirror comprises transistors 26 and 27, and the second current mirror comprises transistor 25 and the first transistor 21 of the power converter 2. Additionally, logic gate 290 receives an output signal of counter 294 and a switching signal on_sw1 for switching transistor 21 in the voltage division mode (also denoted as pure switching). Logic gate 290 controls current flow through the first transistor 21 via driving transistor 292 when bypass transistor 28 disables the two current mirrors. Bypass transistor 28 in turn is enabled by logic gate 291, which receives enable signal en_LDO for entering the voltage regulation mode. Finally, diode 299 and capacitor 298 implement a bootstrap scheme for raising the required voltage to the voltage CBOOT for driving the control circuit.

In FIG. 2, the first transistor 21 is configurable for two functions. An important aspect of this invention is the implementation of a controlled voltage or current source function on a power switch of the charge pump. By making one power switch (here transistor 21) configurable to be a controlled power device for the linear voltage regulation, the switching LDO regulation feature does not need one dedicated device that would require extra die area and might burn extra power through the device in the efficient pure switching mode Here is a list of potential technical features of the dual function power device. Firstly, in the switching LDO mode, the controlled power device is switching like in the pure switching mode. It must be turned off completely in one switching phase, and in the other phase it is turned on and must work as a controlled power source device. In the switching LDO regulation mode, the charge pump is still switching for voltage division while it is regulating its output voltage. Secondly, in the turned-on phase, the controlled source adjusts its current or voltage monotonically to its reference input signal. Thirdly, mode changes between "pure switching" and "switching LDO" are seamless without generating excess current or voltage peaks in the charge pump circuits and the charging system. And fourthly, high efficiency of a charge pump in the pure switching mode is not compromised in most applications of the charge pump. Therefore, the switching LDO feature added in the charge pump does not cause any extra power loss in the pure switching mode.

In the following description, a number of optional features of exemplary power converter 2 and related design considerations are discussed.

Switching Control Loop

The control loop of the switching LDO voltage regulation regulates the output voltage only in the phase that the controlled power switch 21 is turned on. In the other turned-off phase, the regulator loop must be in holding (not active) and keep its regulating states for the following turned-on phase. In the charge pump, even though the control loop is turned on only half of switching time, the system must be stable and reliable in all the operating conditions.

Mode Change Logic

The charge pump may be equipped with a novel voltage regulation feature denoted as switching LDO output voltage regulation. And the charge pump can change its operating mode from the voltage-dividing charge pump operation to the switching LDO operation mode e.g. when it must protect a battery from high input voltage or current.

Signalling the charge pump to enter the switching LDO mode can be done with an over-voltage comparator, an over-current comparator, or an over-temperature regulator. However, detecting the moment for the charge pump to exit from the switching LDO mode may be challenging. If the charge pump exits from the switching LDO mode prematurely, then it will hit an over-voltage panic event soon and forced back to the switching LDO mode. On the other hand, if the charge pump stays in the switching LDO mode even though it would be fine to operate in the pure charge pump mode, this may result in power losses. In this case, the charge pump operates unnecessarily in the LDO mode yielding lower efficiency than it could have in the pure charge pump mode. A rule of selecting an operating mode is that the charge pump must operate the charge pump for best efficiency except when it must provide protection for a battery, for example.

Switching, Controlled Current Mirror on a Power Switch

A controlled current mirror can be built on a power switch tied to a charge pump input and used as a power device for the switching LDO output voltage regulation. FIG. 2 shows circuits around the switching current mirror. In pure charge pump switching, transistor 21 is fully turned on and off by its gate drive signal on_sw1, and the charge pump works as a voltage divider. In switching LDO, a PMOS device P1 28 is turned off by an LDO enable signal en_LDO, and then a NMOS device N1 292 is turned on and off by the gate drive signal on_sw1.

The current mirror presented in this document is called "switching current mirror" because it is turned off in one switching phase and turned on as a current mirror in the other phase. It may not be an accurate linear current mirror and its current may be dependent on a voltage drop on the transistor 21. However, the mirrored current can be set by reference control current and the mirrored current is expected to be monotonically related to the control current. And that monotonic relationship is sufficient for the switching current mirror to work as a power device of the output voltage regulation.

When the switching current mirror is turned on, gate of transistor 21 is driven by control current from transistor P3 27. If the pull-up current is small, it takes significant time to pull the gate voltage over the device threshold voltage. For that reason, an optional kick-start current pulse can be added at the beginning of each turn-on phase.

In the charge pump of FIG. 2, an input power switch (transistor 21) of a charge pump is configurable as a current mirror, and the configured current mirror may be used to ramp up the flying capacitor voltage to the battery voltage level before any charge pump switching. In other words, the current mirror is modified for the switching, controlled current mirror of a switching LDO output voltage regulator.

Digital Control Loop with a Current Counter and IDAC

In FIG. 2, a complete control loop of the switching LDO voltage regulation is made by connecting the switching current mirror to a digital control circuit generating reference control current to the current mirror. In the regulation loop, a voltage comparator 293 generates a digital error signal, and a digital counter 294 integrates the digitized error signal. Then the counter value is converted to the control current through a digital-to-current converter IDAC 295, and the control current sets the switching mirrored current on transistor 21.

Note that the digital up-down counter does may not wrap; i.e. it may not count below 0 or about the maximum (e.g. $2^{N-1}$, where N is the number of bits in the counter). When the counter reaches to 0, it may effectively stop the transfer of charge from the input to the output. The counter may reach a condition for triggering an exit from switching LDO mode back to high efficiency switching (for example in an open loop).

In the first order analysis, the control system has two major poles, one pole is in output by an output capacitor and the other one is by the integrating current counter 294. The diode-connected switching mirror circuits create two minor poles in the system at much higher frequencies than the major poles. Therefore, the system can be made stable with one phase compensation zero made by a feedforward current path. This 'gff' path is illustrated in FIG. 2 using gain factor 297.

Figures 3A, 3B:
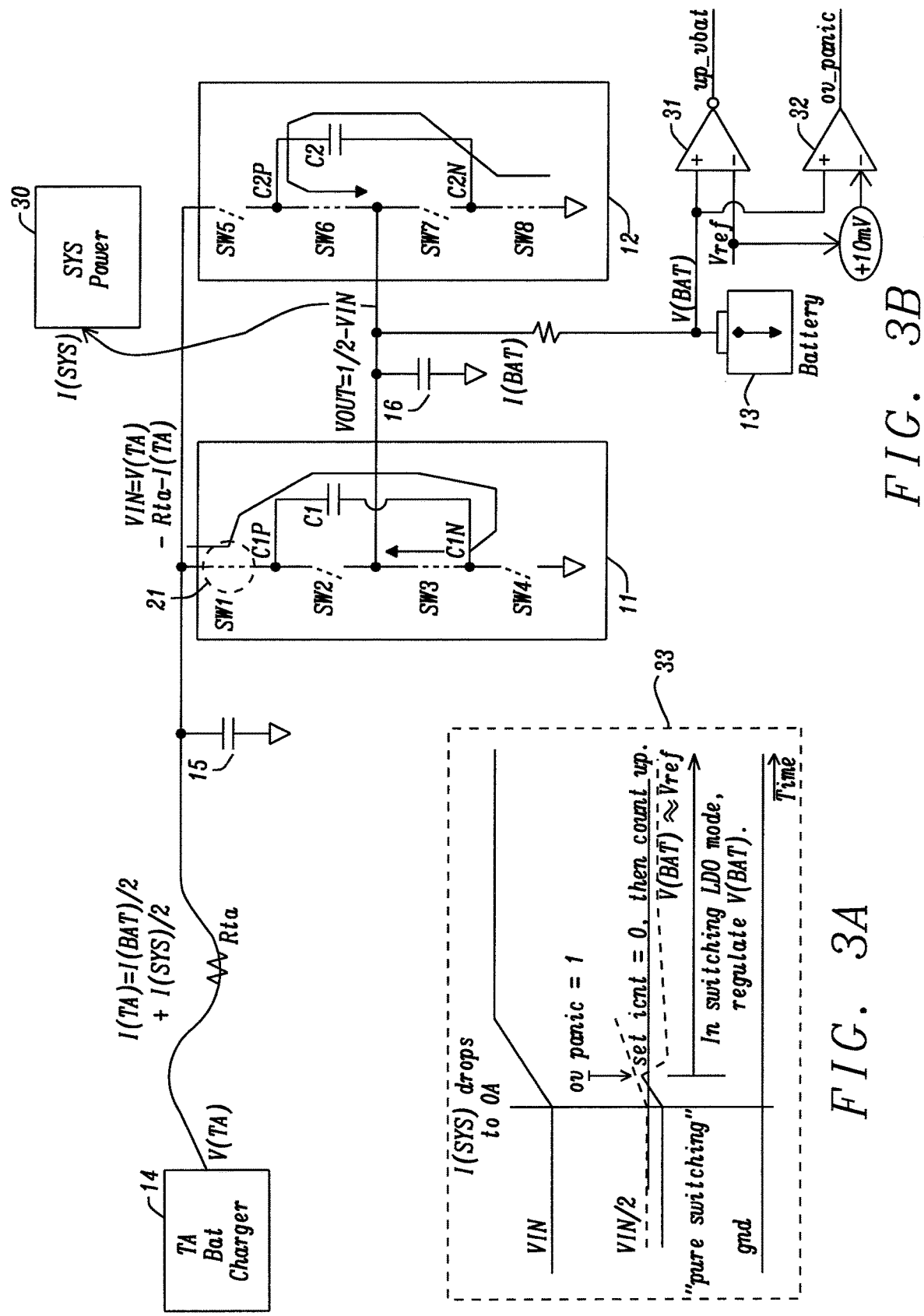
FIGS. 3A and 3B illustrate another exemplary power converter connected between a travel adapter and a battery.

The control loop in FIG. 3B is based on digital circuits because its error signal is digital, and its control current has also discrete values set by a digital current counter value and a digital error signal. Furthermore, the switching current mirror is a simple current source multiplying its control current. By virtue of their digital design, the circuits are relatively easy to build and robust against most noises.

The described control loop may be active only when the switching current mirror is turned on. When the loop is not active, the control loop is disconnected because the controlled current mirror is turned off. In that off phase, digital control states are kept and updated so that regulation can resume in the next turned-on phase without any disruption.

In FIG. 2, if the current counter value is zero, the switching current mirror may be completely turned off by pulling its gate-source voltage down even it is in the turned-on phases (i.e. digitally keep N1 292 turned on when the counter value is zero). This feature may be required to cut off current and stop charging voltage rising further immediately when it hits the over voltage panic as shown in FIG. 3A.

FIG. 3B illustrates another exemplary power converter connected between a travel adapter 14 and a battery 13. In FIG. 3B, the same reference numerals are used to denote identical circuit elements as in the previous FIGS. 1 and 2. In particular, the power converter illustrated in FIG. 3B comprises a transistor 21 which is operated as a controllable power source as discussed with regard to FIGS. 1 and 2. Please note that the control circuit for controlling transistor 21 is not shown in FIG. 3B. However, in contrast to the previous figures, FIG. 3B shows how an electronic device 30 may be powered directly with the help of the presented power converter. Moreover, the power converter of FIG. 3B comprises an overvoltage comparator 31 for generating the signal up_vbat and a panic comparator 32 for generating the signal ov_panic. Diagram 33 in FIG. 3A illustrates an exemplary transition between the pure switching mode (voltage division mode) and the switching LDO mode (voltage regulation mode) in response to an increased output voltage.

In fact, in FIG. 3B, a direct battery charging system is depicted that has two charge pumps between a travel adaptor 14 and a battery 13. In the system, both charge pumps divide their input voltage and multiply the charging current by two. The two charge pumps are arranged in parallel and their switching is either synchronized (i.e. in phase) or interleaved (i.e. with opposite phases such that the first charge pump is charging its flying capacitor while the second charge pump is discharging its flying capacitor and vice versa). In FIG. 3B, the case of interleaved switching is illustrated using arrows for indicating the current flows in both charge pumps. Using two charge pumps allows the system to charge the battery 13 with an increased current and minimal power loss in the charge pumps.

In a conventional charging system without the controllable power source presented in this document, if charging voltage becomes too high due to high travel adaptor voltage, the conventional charging system has two options to take for protection of a battery. The charge pumps can stop their charge pump switching and cut off current from input to output, or they can ask the travel adaptor to lower its voltage through an application processor not drawn in FIG. 3. For example, a different input voltage may be selected according to the universal serial bus USB 3.0 power delivery PD protocol. In these cases, the charging system must either stop charging operation for protection of a battery or allow a battery exposed to high charging voltage while waiting for lower travel adaptor voltage.

If the charge pumps in the system have the switching LDO voltage regulation feature of this invention, for high input voltage, the system does not have to stop charging and does not have to wait for lowered voltage. Once it detects its charging voltage is too high, it initially cuts off its charging current and prevent charging voltage rising further, then it can regulate charging voltage at safe voltage level. Under this protection scheme, the charging system can protect a battery from high input voltage and continue charging operation with minimal disruption.

Figure 4:
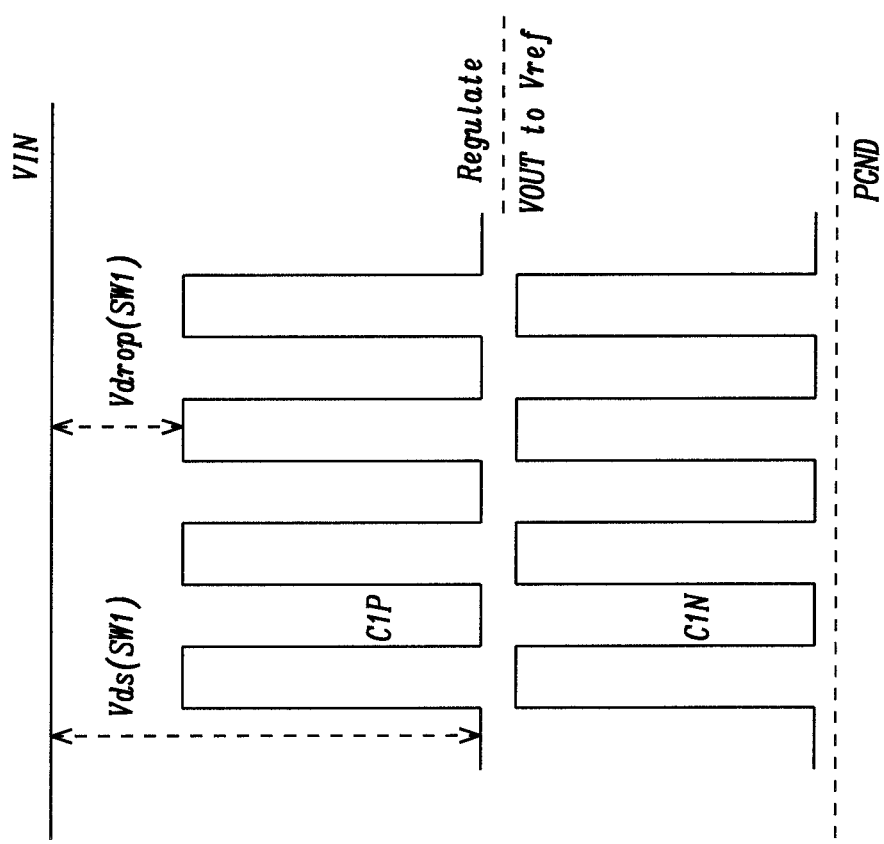
FIG. 4 illustrates typical waveforms of key signals in steady state of the switching LDO regulation.

FIG. 4 illustrates typical but only exemplary waveforms of key signals in steady state of the switching LDO regulation. In steady state, output voltage is regulated at a reference voltage Vref, the bottom node of a flying capacitor swings from ground to VOUT and the top node of the flying cap swings from VOUT to 2·VOUT. In the switching phase when the top node (C1P) is high, the current mirror is turned on and its dropout voltage of SW1 is (VIN−2·VOUT). In the other phase when C1P is low, the current mirror is turned off and the drain-to-source voltage of SW1 is about (VIN−VOUT).

Transition Between Pure Charge Pump Switching Mode and Switching LDO Mode

The digital control logic of switching LDO regulation in FIG. 2 allows to implement seamless transitions between two operating modes. First, transition from one mode to another may be synchronized to the charge pump switching clock and the transition event may be forced to happen always in a switching phase when the power switch SW1 is turned off. Therefore, the transition will have no immediate effect on current and voltage of charge pump circuits, because SW1 is off anyway during the transition.

When it enters the switching LDO mode, the current counter in control logic may be reset to a specific value to set control current to the switching current mirror at the beginning of LDO mode. Then, the control loop may take over its regulation function by counting up or down the current counter, based on the digital error signal.

When the hybrid charge pump exits from the switching LDO mode, it may check whether input voltage is about two times of its output voltage at the time. If the input voltage is too high (e.g. higher than two times of output voltage), the charge pump will have high currents on power switches and a flying capacitor in first few switching cycles in the pure switching mode.

In the control loop of FIG. 2, the current counter value can be a good indicator for correct input voltage level for transition from LDO mode to pure switching mode without causing excess currents on the circuit. If the counter hits its max value and the voltage comparator signals "counting-up", then the controlled current mirror of SW1 has very small dropout voltage. In this condition, input voltage of the charge pump is less than or about two times of output voltage, and it may be time to exit its switching LDO mode without causing excess current on circuits.

Entering in Switching LDO Regulation

When the charge pump hits over-voltage panic, it may enter the switching LDO regulation mode and reset the error integrating current counter to zero or to a value different from zero if required. The over-voltage panic refers to ov_panic signal in FIG. 3A, which is generated by VOUT (VBAT) reaching to the pre-set panic level. Then may start switching as a switching LDO. By that way, the charge pump guarantees no current from input at the panic and makes sure to stop rising output voltage. Then, the control loop tries to regulate the output voltage based on the comparator output results. If the output voltage is higher than the reference voltage, it may signal "count down". Otherwise, it may count the current counter up and raise the mirrored switching current until the output voltage becomes higher than reference voltage. Then the system is in voltage regulation and the digital current counter may be up and down in the steady state regulation.

A charge pump has best efficiency as a current doubler in the pure switching mode. Therefore, the charge pump must be in the switching LDO mode only when it is required to protect a battery from high input voltage. However, there may be no signal indicating a moment in time to exit from the switching LDO mode. If the charge pump exits prematurely from switching LDO, it will hit the panic again and get back to switching LDO. If there are frequent mode bouncing between switching LDO and pure switching, battery charging operation will be unnecessarily disrupted by the mode bouncing and the charging time will be longer.

Exit from the Switching LDO Regulation

The charge pump could determine the right condition to exit from the switching LDO mode by monitoring its input voltage. If its input voltage is low enough, the charge pump could exit from switching LDO mode and might be able to stay in the pure switching mode without bouncing back to the LDO mode. However, it is difficult to determine the correct input voltage level for the exit, because the voltage depends on multiple parameters such like output current, switch resistance, temperature, etc.

An advantage of using the digital control loop in FIG. 2 is that the current counter value is a good indicator for the exit condition. That is, if its current counter is up to the maximum value and its output voltage is still lower than a reference voltage, then the charge pump is better to exit from its LDO mode and try to operate in pure switching. In that switching LDO operating condition, because dropout voltage in the current mirror device is too low, the switching current mirror is not able to drive enough current for battery charging. In that condition, the current mirror operates as a resistor and its current is linearly proportional to the low dropout voltage.

Therefore, if the charge pump exits the switching LDO in that condition, the charge pump has good chance of staying in the pure switching mode without hitting over-voltage panic. However, one issue observed in simulations is that output voltage may go up in the mode change because the charge pump has higher efficiency in the pure switching than in the switching LDO mode. In very narrow operating condition, voltage bumps in the transition can produces "mode bouncing". This mode bouncing is generated by the transition from regulation with maximum code on the digital counter (when the gate of SW1 is still limited by the current mirror) to high efficiency switching (when the gate of SW1 is free to go higher). This will cause VOUT to go slightly higher than it was in regulation and there is a chance to hit again the level to enter back in regulation mode.

Steady State of the Switching LDO Voltage Regulation

Figures 5A, 5B:
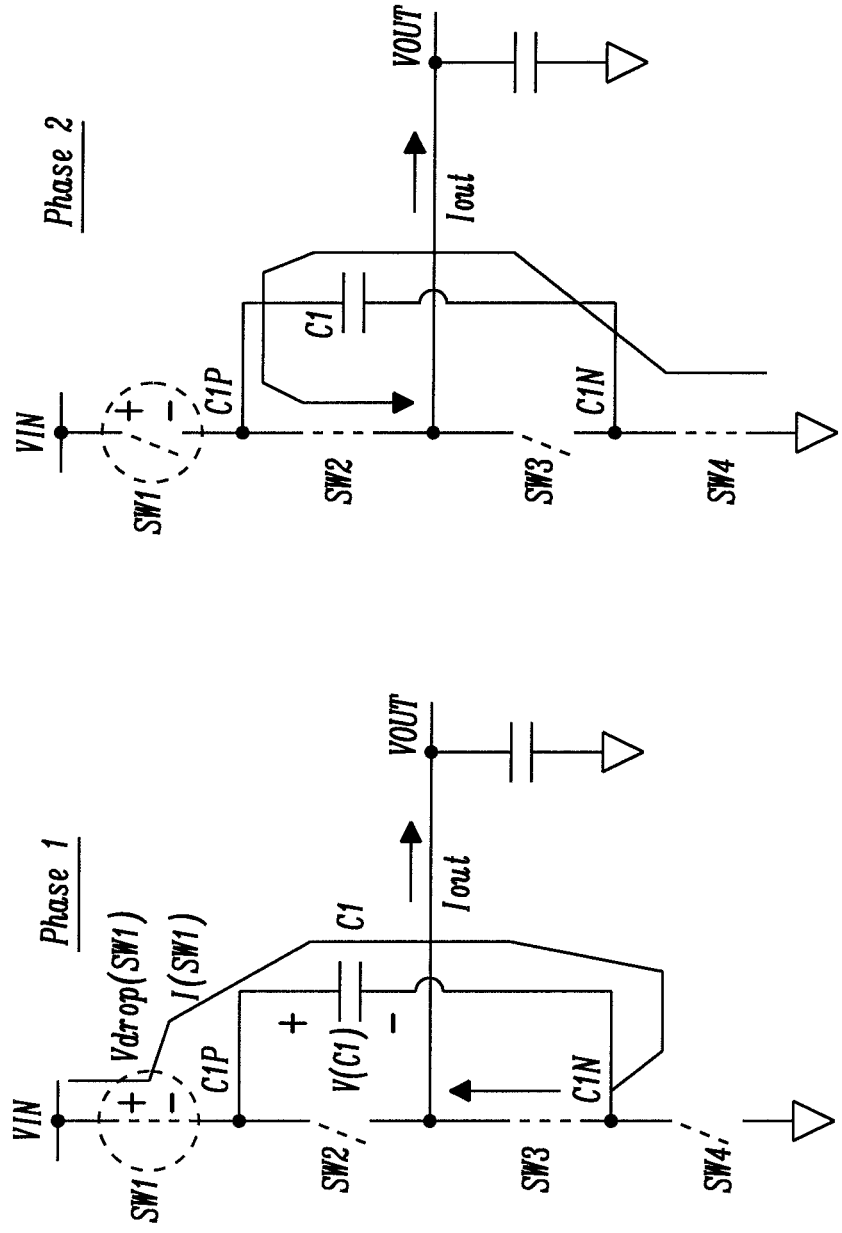
FIGS. 5A and 5B show charge pump current through a flying capacitor in two switching phases.

FIGS. 5A and 5B show charge pump current through a flying capacitor in two switching phases (phases 1 and 2). In phase 1, current flows from input to output charging a flying capacitor in the current path, and in phase 2, the flying capacitor discharges and causes current to flow from ground to output. In steady state of the switching LDO regulation, flying cap voltage will be same at the end of each switching cycle which is alternating phase 1 and phase 2 with 50% duty cycle. In phase 1, flying cap voltage rises because it is charged by the current flowing through it from input to output, and in phase 2, flying cap voltage drops because it is discharging current to output. In the steady state, flying capacitor currents averaged over phase 1 and phase 2 have same magnitude, but opposite direction.

Let's see averaged currents in phase 1 of FIG. 5A. The current from the SW1 current mirror flows through a flying cap to output. If currents are averaged over the phase, $I(SW1) = I(C1)$, $I(C1) = Iout$, and $Iout = Iload$ in Phase 1.

In phase 2, current from the flying cap has higher transient peaks because it is discharging to output through two switches fully turned on. However, if it is averaged out over the switching phase, $-I(C1) = Iout$, and $Iout = Iload$ in Phase 2.

In steady state of the switching LDO regulation mode, output voltage difference in phase 1 and 2 can be ignored for the first order analysis. In regulation, output voltage is Vref with some switching ripple voltage:

$VOUT \approx Vref$.

In phase 2, output voltage is determined by flying cap voltage and Ron voltage drop of two switches SW2 and SW4. Using averaged voltage and current signals, $VOUT \approx V(C1) - Iload \cdot (2 \cdot Ron)$ In phase 1, current is from input to output and flow through SW1 mirror, flying cap and SW3. Therefore, output voltage is given by, $VOUT \approx VIN - Vdrop(SW1) - V(C1) - Iload \cdot (1 \cdot Ron)$ From two previous equations, V(C1) can be cancelled out ignoring small voltage difference on the flying cap in two phases.

$VOUT \approx (VIN - Vdrop(SW1))/2 - Iload \cdot (3 \cdot Ron)$.

This equation can be interpreted by this way: VIN is dropped by Vdrop(SW1) of a current mirror device SW1, and the dropped VIN is divided by 2 through the switching charge pump operation, and then the divided voltage has additional Ron voltage drop before becoming VOUT. By rearranging the previous equation, Vdrop(SW1) can be represented by $Vdrop(SW1) \approx VIN - 2 \cdot VOUT - Iload \cdot (3 \cdot Ron)$.

It should be mentioned that the above approximations in steady state are valid when $\Delta V(C1)$ and $\Delta V(VOUT)$ are minimal in phases 1 and 2.

Prevention of Over-Heating in the Regulation Mode

In the switching LDO regulation mode, power loss on the current mirror SW1 can be approximated by $Ploss(SW1) \approx 0.5 \cdot (Iload \cdot Vdrop(S1))$ because SW1 is turned on only in phase 1 (50% duty cycle) and I(SW1) is same to Iload in average in steady state. Because the power loss is linearly proportional to the voltage drop, it is possible that the chip can be overheated in high input voltage and it can hit the thermal shutdown (if it operates in the switching LDO mode for long enough time). In that case, battery charging operation will be interrupted, and it will take longer time to charge a battery fully.

Figure 6:
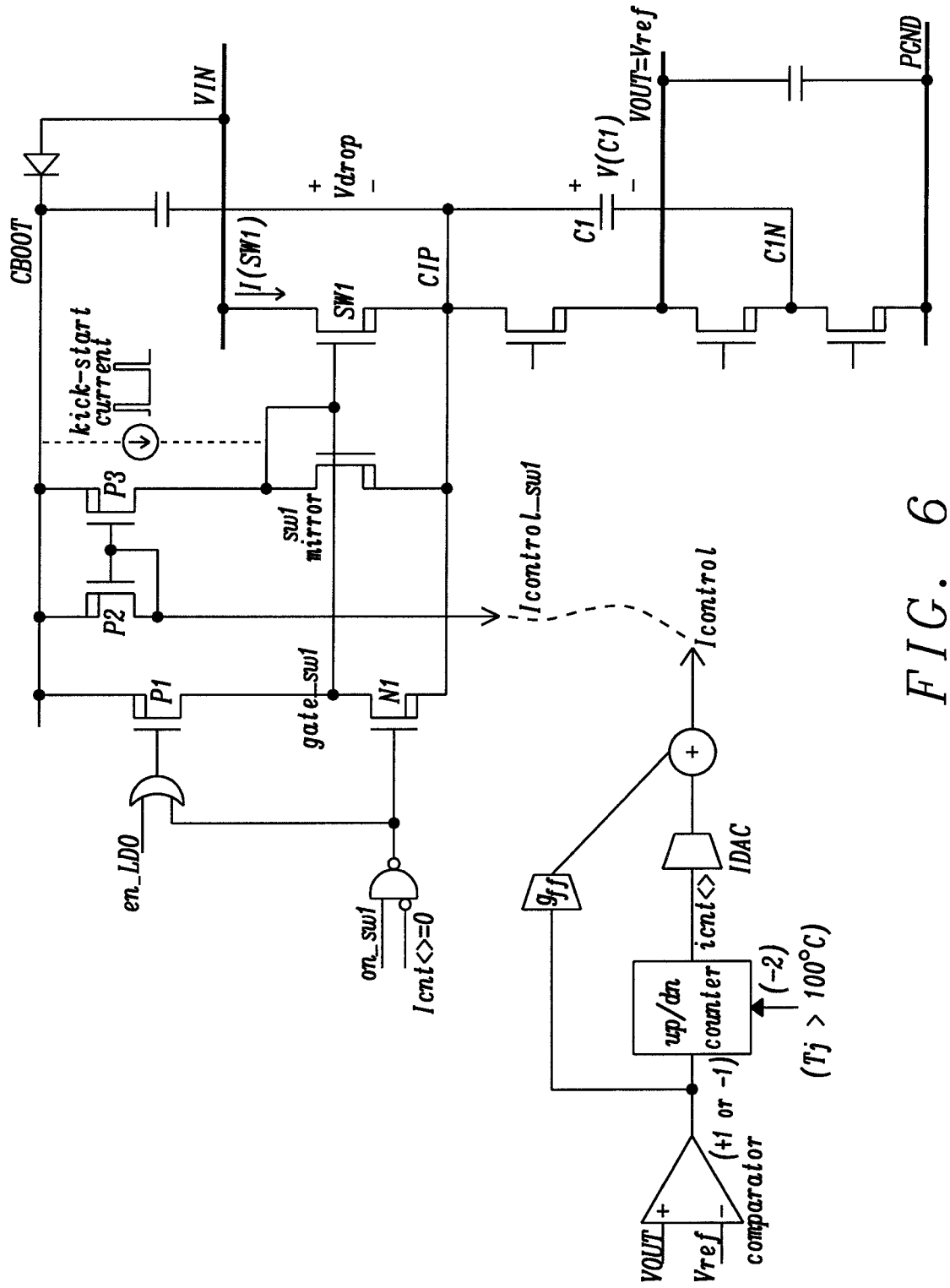
FIG. 6 shows an improved feedback loop for taking into account temperature effects.

It is feasible to prevent overheating of a chip in the switching LDO regulation mode by adding temperature of a chip to the control loop. First, monitor its junction temperature, and if temperature is too high, lower its switching mirrored current by counting down the current counter. In FIG. 6, if junction temperature is higher than 100° C., current counter is decremented by 2. This addition of a negative feedback will lower charging current and voltage temporarily. However, it can continue charging a battery without interruption.

Analog Control Loop

Figure 7:
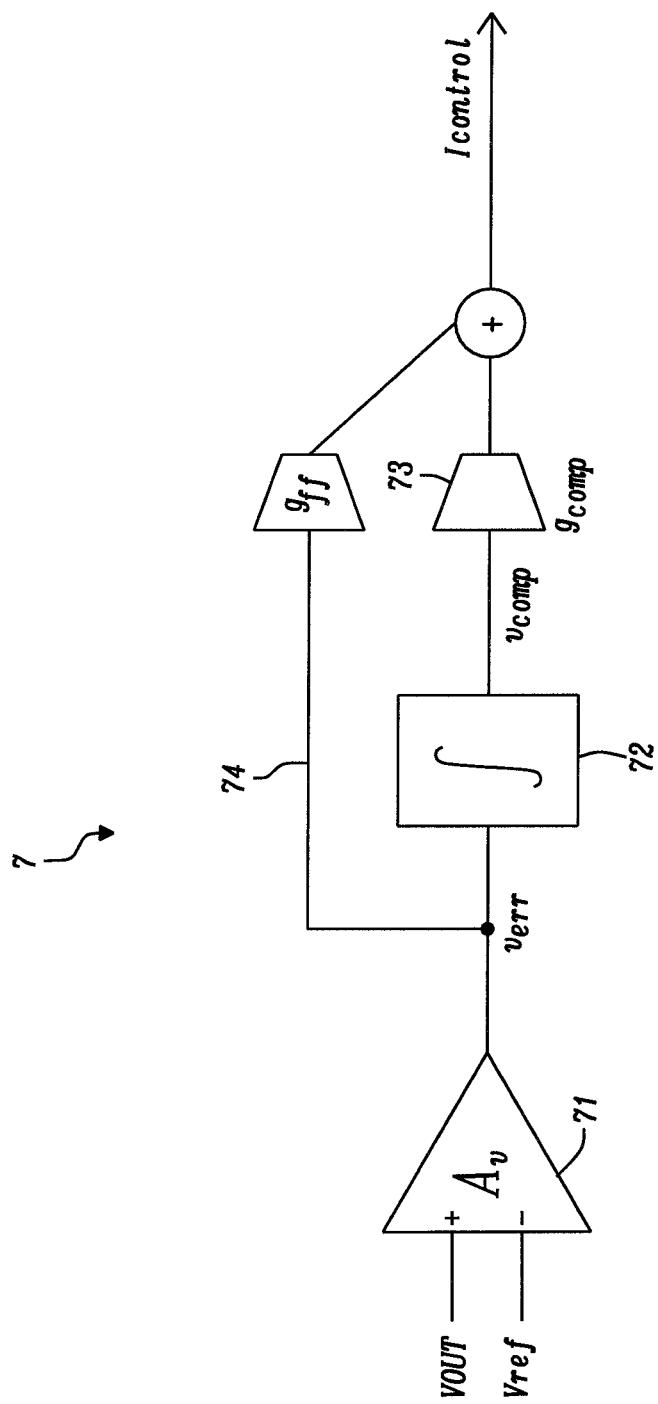
FIG. 7 shows an exemplary analog control loop.

The digital control loop in FIG. 2 can be replaced by a basic analog control loop 7 made of an error amplifier 71, integrator 72, and voltage-to-current converter 73 in FIG. 7. Since this analog controlled system is still a two-pole control system, it can be stabilized with an addition of a feedthrough current path 74.

Frequent Mode Bouncing

Figure 8:
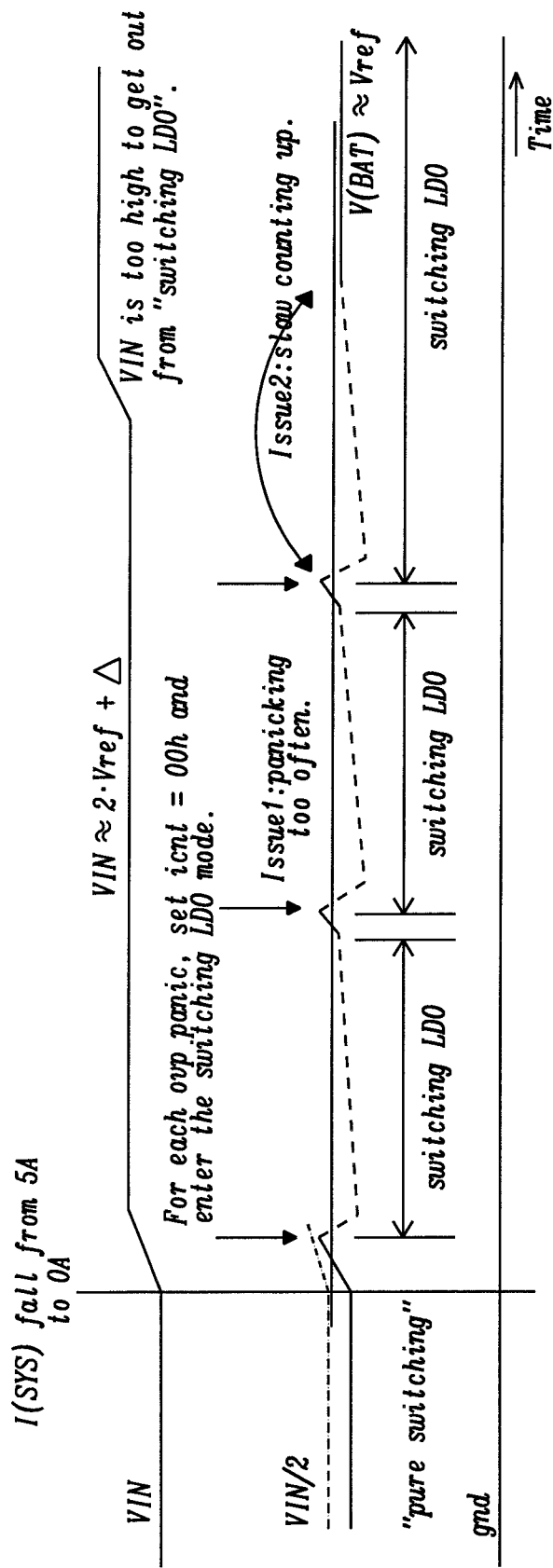
FIG. 8 shows frequent panics and slow response in an exemplary control loop.

FIG. 8 illustrates two potential issues of the switching LDO regulation system in FIG. 2. One issue observed in simulations is that it is possible to hit the over-voltage panic soon after it exits from the switching LDO mode, because output voltage rapidly increases in the normal (non-LDO) mode. The other issue is that delay from an initial panic to voltage regulation could be too long for some applications, because the current counter in the control loop is incrementing in small step every switching cycle.

Slow Transient Response

Figure 9:
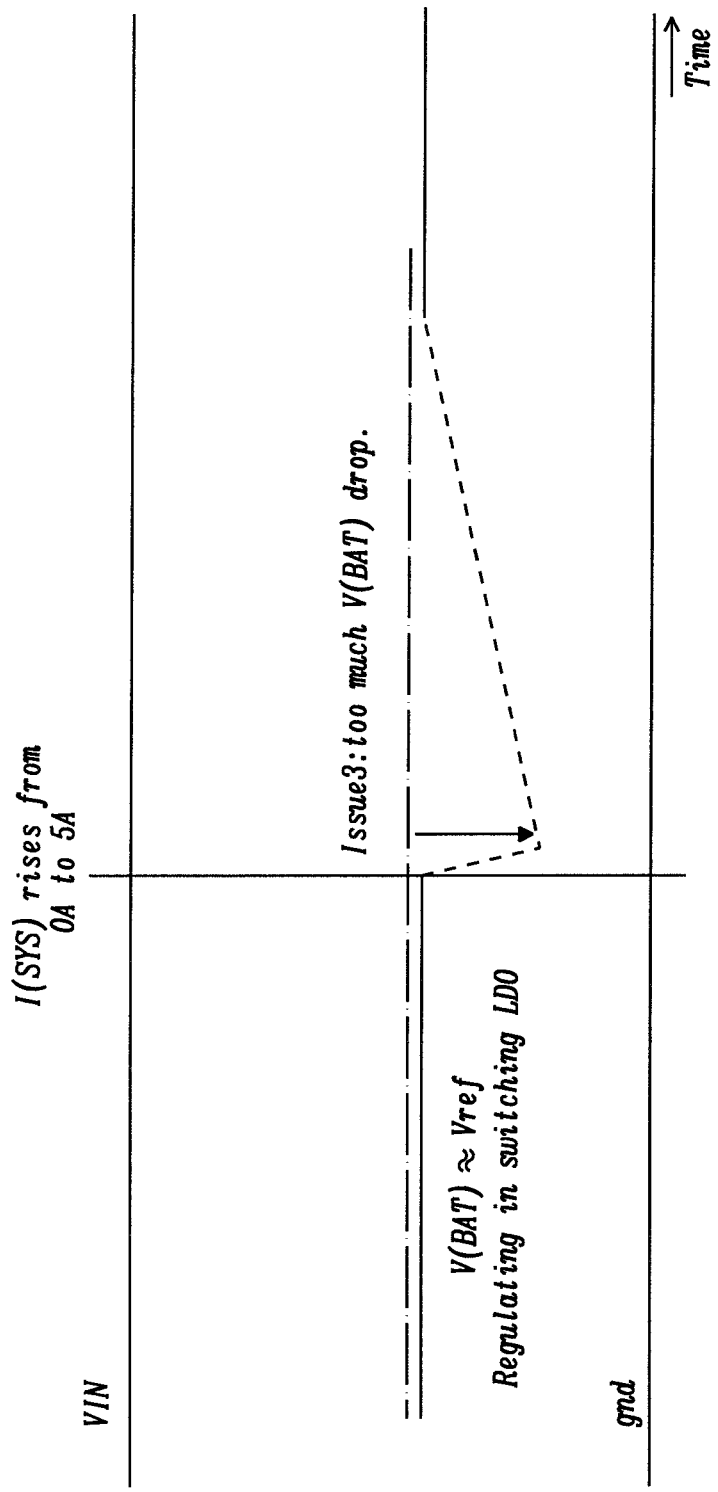
FIG. 9 shows a substantial drop of the output voltage.

In the switching LDO regulation mode, the slow transient response of the control system could allow large output voltage drops and disrupt charging operation. Because the current counter in the control system of FIG. 2 is counting in a small fixed step, it takes long time to raise the switching LDO current for sudden rise of load current. In addition, the system does not have an under-voltage panic signal in FIG. 2 (see also FIG. 9).

Fix of Mode Bouncing and Slow Transient Response

FIGS. 10A, 10B and 10C show new features that might be added into the basic digital control logic in FIG. 2 to mitigate effect of the mode bouncing and to improve transient response of the switching LDO voltage regulation. First, a counter may be added to impose a minimum LDO period. This minimum time counter can prevent frequent mode bouncing between switching LDO and pure switching by forcing the system in switching LDO for a longer period before exiting from the LDO mode. Secondly, it adds a VOUT under-voltage panic comparator to detect large voltage drop at output. For faster response to the load transient, the VOUT uv-panic signal directs the current counter to increment in a large step and raise its control current by adding a step value to the current counter output during the VOUT under-voltage panic.

Figure 11A:
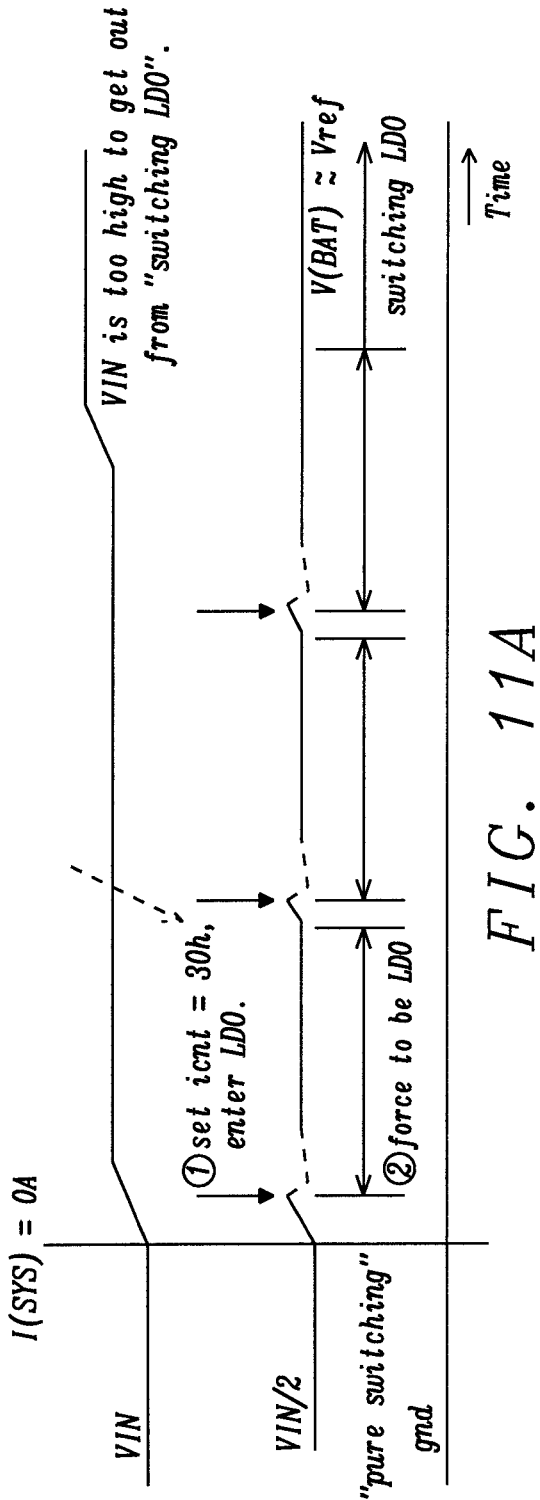
FIGS. 11A and 11B show improved transient responses.
Figure 11B:
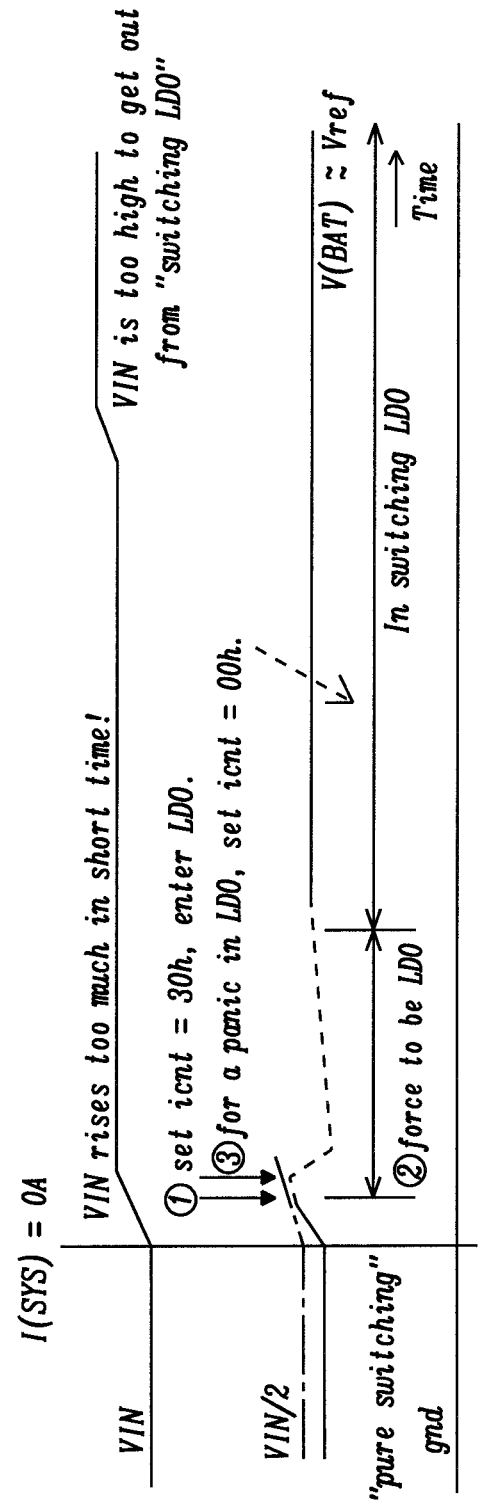

Another trick used for the fast-transient response is that the current counter is reset to a high initial number instead of resetting it to zero when it hits VOUT "ov_panic". By doing so, the system could settle in regulation of its output voltage at reference voltage quickly after hitting VOUT ov_panic. FIGS. 11A and 11B explain a case of resetting its current counter to 30 h (instead of 0) and imposing the minimum LDO period with the min counter.

When the current counter is reset to a higher value than zero, that creates a new issue that can be taken care of if required. Because the switching LDO current is set by the initial counter value at the beginning of switching LDO mode, it is possible for output voltage to keep rising even in the LDO mode, if the initial LDO current is higher than the load current at the time. In the design of FIG. 10, that issue is resolved by introducing two tier responses for the panics. If it hits a panic, its current counter is set to a non-zero value expecting for the system to be in regulation fast. However, if it hits VOUT ov_panic again in short time window because the initial LDO current is higher than load current, then the current counter is reset to zero and cut off the LDO current completely. FIG. 11 shows an example where the current counter is initially set to 30 h, and then reset to 0 because ov_panic is on even in LDO mode due to rising output voltage.

Figure 12:
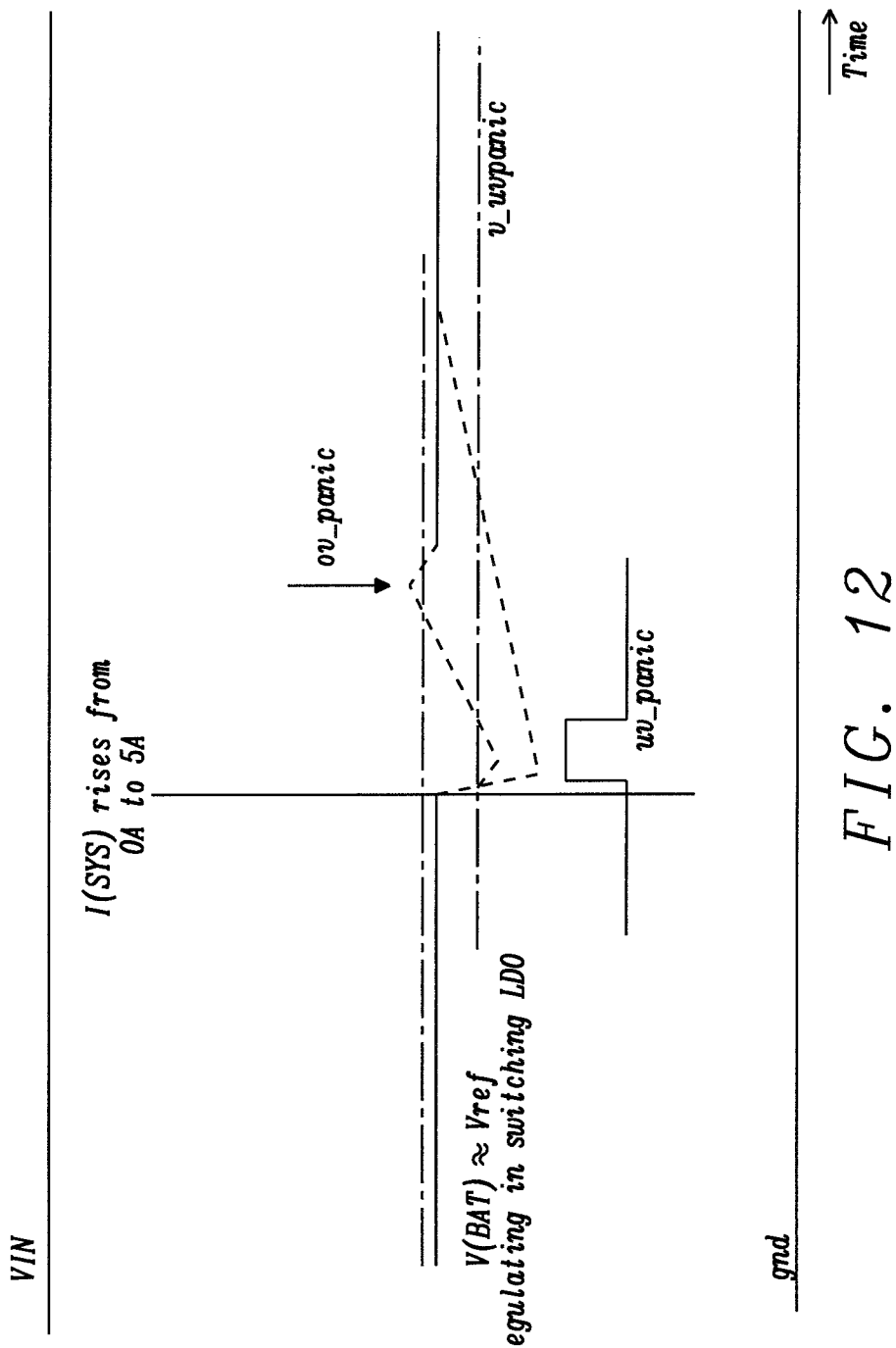
FIG. 12 shows a transient response for a VOUT under-voltage panic event.

FIG. 12 illustrates a transient response for a VOUT under-voltage panic event. In the figure, voltage drop is mitigated by the large panic feedforward current and by fast increment of the current counter during the panic event.

Alternative Circuits

Figures 13A, 13B:
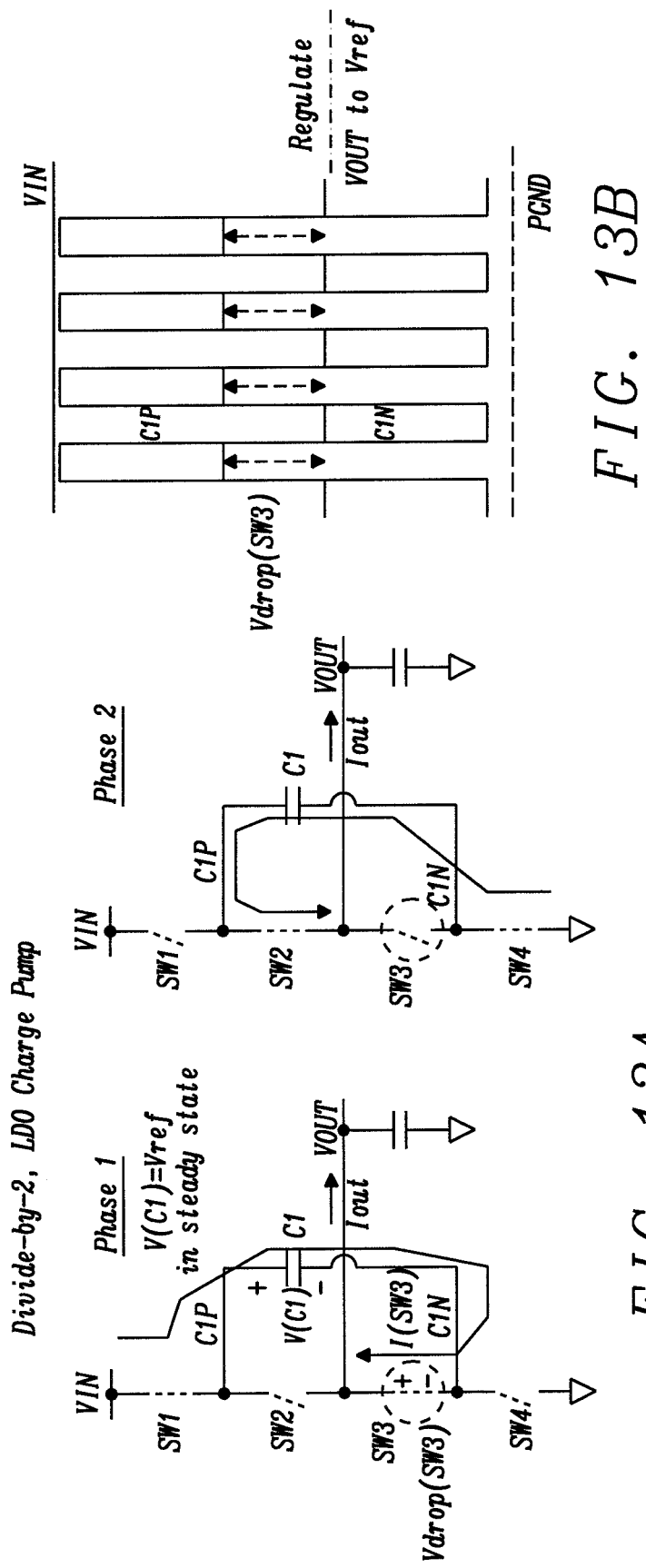
FIGS. 13A and 13B show an alternative power converter with one transistor operated as a controllable power source.
Figures 14A, 14B:
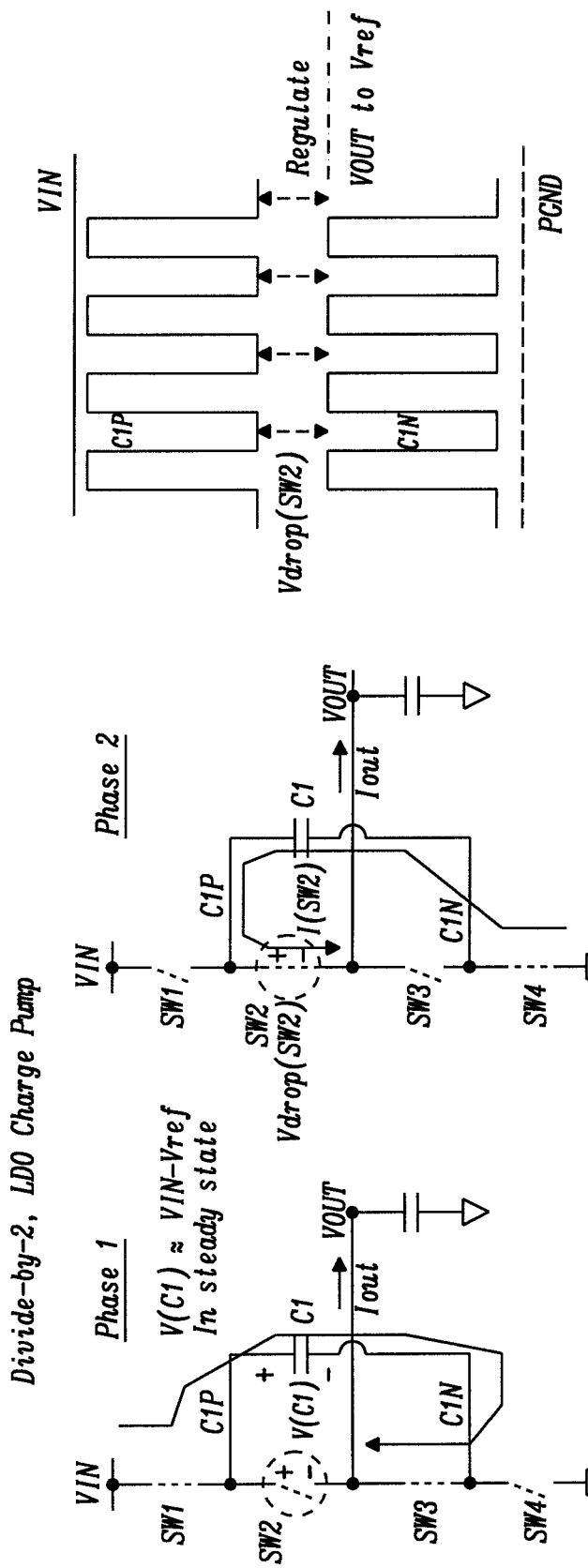
FIGS. 14A and 14B show an alternative power converter with one transistor operated as a controllable power source.
Figures 15A, 15B:
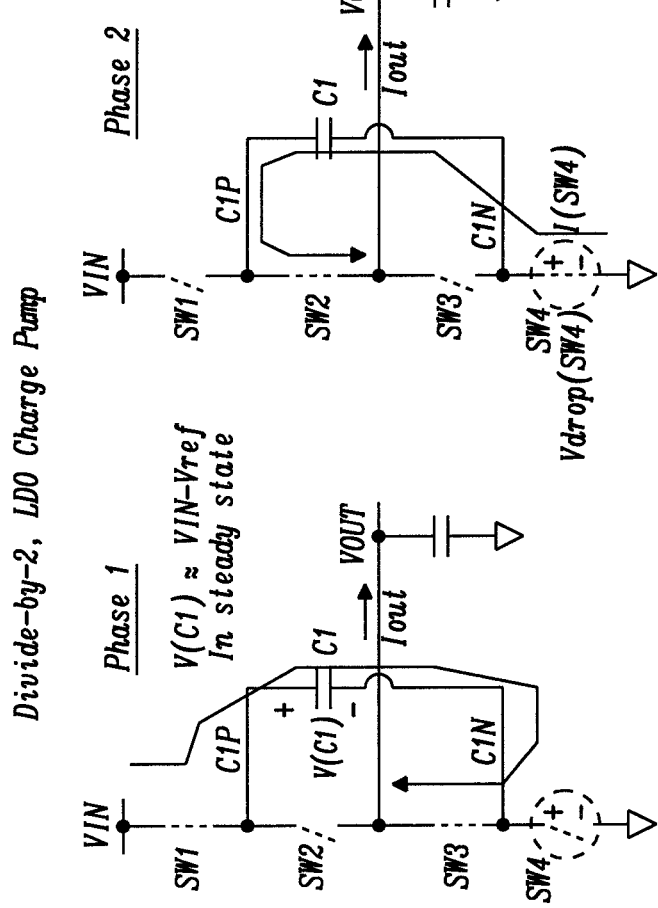
FIGS. 15A and 15B show an alternative power converter with one transistor operated as a controllable power source.

The switching LDO voltage regulation can be built with SW3 instead of SW1 (FIGS. 13A and 13B). In phase 1, SW3 is a controlled current mirror which is driving current set by the digital control loop, from input to output through a flying capacitor C1. Because current on the mirror is flowing from source to drain of SW3, V(CN) swings from ground to voltage of VOUT+Vdrop(SW3), and V(CP) swings from VOUT to VIN. In FIGS. 14A and 14B, the current mirror is built on SW2 and turned on as a switching controlled current mirror in phase 2 for the output voltage regulation. Since Vdrop(SW2) is from CP1 to VOUT, V(CP) swings from VIN to voltage of VOUT+Vdrop(SW2). FIGS. 15A and 15B show a switching current mirror on SW4 in phase 2. Because current is flowing from ground to output through the current mirror in phase 2, V(CN) swings from VOUT to voltage of OV−Vdrop(SW4).

In other embodiments, the regulation feature may be implemented on any of SW1 to SW4 and safety (panic) may be implemented on any other switch from SW1 to SW4. The advantage of the invention is that the regulation/safety is done on the existing power FETs and don't need other power FETs on the input side nor on the output.

Figure 16:
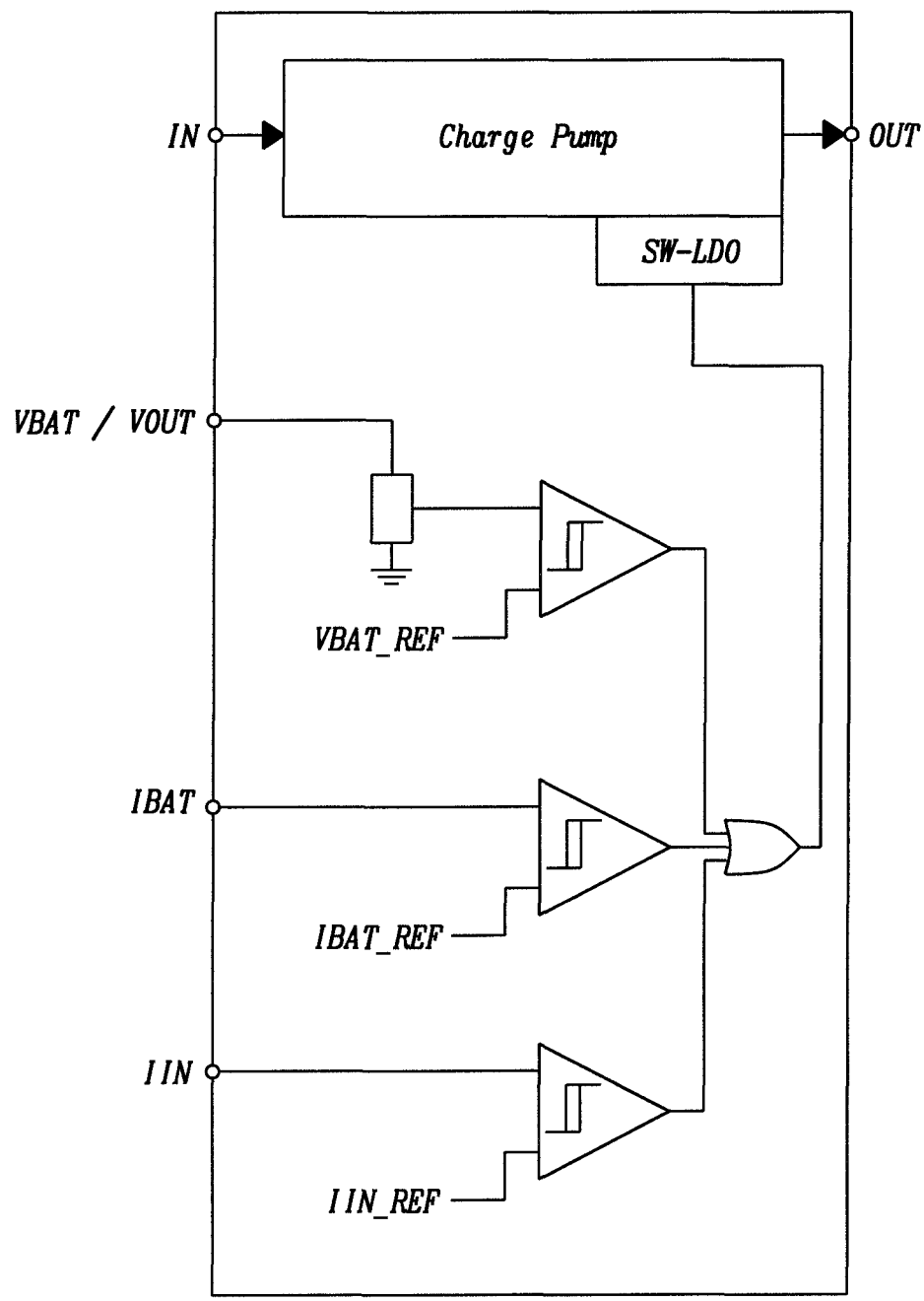
FIG. 16 shows alternative feedback circuits.

This disclosure details a regulation loop based on VOUT (VBAT). Other regulation loops may be added and combined using the scheme below. As shown in FIG. 16, there are other parameters possible to be added to the regulation loops: battery current (IBAT), input current (IIN), input voltage (VIN), temperature (die, battery, USB connector), etc.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof

What is claimed is:
1. A power converter comprises a capacitive element, a first transistor, a second transistor, a third transistor, and a fourth transistor, wherein
  the first transistor is coupled between an input terminal of the power converter and a first terminal of the capacitive element,
  the second transistor is coupled between the first terminal of the capacitive element and an output terminal of the power converter,
  the third transistor is coupled between the output terminal of the power converter and a second terminal of the capacitive element,
  the fourth transistor is coupled between the second terminal of the capacitive element and a reference potential,
wherein the power converter further comprises a control circuit configured
  to enter a voltage regulation mode, and
  to control, during a first time interval of said voltage regulation mode, one of the four transistors such that the one of the four transistors is operated as a control- lable current source for regulating an output voltage at the output terminal of the power converter;

wherein the control circuit comprises a comparator configured to generate an error signal by comparing a reference signal with a feedback signal, an integrator or counter configured to generate a cumulated error signal based on the error signal, a controlled current source configured to generate a reference current based on the cumulated error signal, and a current mirror comprising the one of the four transistors and a mirror transistor, the current mirror configured to control a current through the one of the four transistors according to the reference current.

2. The power converter according to claim 1, wherein the control circuit is configured to enter the voltage regulation mode if an overvoltage is detected at the input terminal of the power converter.

3. The power converter according to claim 1, wherein the control circuit is configured to, during the first time interval of the voltage regulation mode, control the three remaining transistors such that the three remaining transistors are operated as switches which are either open or closed.

4. The power converter according to claim 1, wherein the control circuit is configured to, during a second time interval of said voltage regulation mode, control the one of the four transistors such that the one of the four transistors is operated as an open switch.

5. The power converter according to claim 4, wherein the control circuit is configured to, during the second time interval of said voltage regulation mode, control the three remaining transistors such that the three remaining transistors are operated as switches which are either open or closed.

6. The power converter according to claim 1, wherein the control circuit is configured to exit the voltage regulation mode and to enter a voltage division mode, and to control all four transistors such that all four transistors are operated as switches which are either open or closed.

7. The power converter according to claim 6, wherein the control circuit is configured, during a first phase of the voltage division mode, to close the first transistor and the third transistor, and to open the second transistor and the fourth transistor for generating an electrical path from the input terminal via the capacitive element to the output terminal.

8. The power converter according to claim 6, wherein the control circuit is configured, during a second phase of the voltage division mode, to open the first transistor and the third transistor, and to close the second transistor and the fourth transistor for generating an electrical path from the reference potential via the capacitive element to the output terminal.

9. The power converter according claim 1, wherein the control circuit is configured to determine a time for exiting the voltage regulation mode and for entering a voltage division mode based on a state of said integrator or based on a state of said counter.

10. The power converter according to claim 1, wherein the control circuit comprises a bypass switch for disabling the current mirror such that the one of the four transistors is operated as an open switch during the second time interval of said voltage regulation mode, or operated as a switch which is either open or closed when the control circuit has entered a voltage division mode.

11. The power converter according to claim 1, wherein the feedback signal is indicative of one of an input voltage at the input terminal of the power converter, an input current at the input terminal of the power converter, an output voltage at the output terminal of the power converter, an output current at the output terminal of the power converter, or a temperature associated with the power converter.

12. The power converter according to claim 1, wherein the control circuit is configured to, when entering the voltage regulation mode, control the one of the four transistors such that a current through this transistor is interrupted and then successively increased again.

13. A method for operating a power converter, the power converter comprising a capacitive element, a first transistor, a second transistor, a third transistor, and a fourth transistor, the method comprising:

coupling the first transistor between an input terminal of the power converter and a first terminal of the capacitive element, coupling the second transistor between the first terminal of the capacitive element and an output terminal of the power converter, coupling the third transistor between the output terminal of the power converter and a second terminal of the capacitive element, coupling the fourth transistor between the second terminal of the capacitive element and a reference potential, entering a voltage regulation mode, controlling, during a first time interval of said voltage regulation mode, one of the four transistors such that the one of the four transistors is operated as a controllable current source for regulating an output voltage or current at the output terminal of the power converter;

wherein the control circuit comprises a comparator configured to generate an error signal by comparing a reference signal with a feedback signal, wherein the power converter is configured to control, based on the error signal, a current through the one of the four transistors, generating an error signal by comparing a reference signal with a feedback signal, generating a cumulated error signal by integrating the error signal or by counting signal values of the error signal, providing a controlled current source for generating a reference current based on the cumulated error signal, and providing a current mirror comprising the one of the four transistors and a mirror transistor, for controlling a current through the one of the four transistors according to the reference current.

14. The method according to claim 13, further comprising entering the voltage regulation mode if an overvoltage is detected at the input terminal of the power converter.

15. The method according to claim 13, further comprising controlling, during the first time interval of the voltage regulation mode, the three remaining transistors such that the three remaining transistors are operated as switches which are either open or closed.

16. The method according to claim 13, further comprising controlling, during a second time interval of said voltage regulation mode, the one of the four transistors such that the one of the four transistors is operated as an open switch.

17. The method according to claim 13, further comprising controlling, during the second time interval of said voltage regulation mode, the three remaining transistors such that the three remaining transistors are operated as switches which are either open or closed.

18. The method according to claim 13, wherein the feedback signal is indicative of one of
   an input voltage at the input terminal of the power converter,
   an input current at the input terminal of the power converter,
   an output voltage at the output terminal of the power converter,
   an output current at the output terminal of the power converter, or
   a temperature associated with the power converter.

* * * * *